(12) United States Patent
Ziegler et al.

(10) Patent No.: US 6,459,035 B2
(45) Date of Patent: Oct. 1, 2002

(54) PHOTOVOLTAIC CELL HAVING A COLORED APPEARANCE, PARTICULARLY FOR A WATCH DIAL

(75) Inventors: Yvan Ziegler, Villiers; Diego Fischer, Neuchâtel; Eric Saurer, Bevaix; René Viennet, Neuchâtel, all of (CH)

(73) Assignee: Asulab S.A. (CH)

( * ) Notice: Subject to any disclaimer, the term of this patent is extended or adjusted under 35 U.S.C. 154(b) by 0 days.

(21) Appl. No.: 09/738,761

(22) Filed: Dec. 18, 2000

(30) Foreign Application Priority Data

Dec. 27, 1999 (CH) ................. 2381/99

(51) Int. Cl.⁷ ............... H01L 31/0216; G04G 19/02
(52) U.S. Cl. .......... 136/257; 136/246; 136/256; 136/244; 136/261; 136/258; 368/205; 438/65; 438/69; 438/70; 438/96; 257/436; 257/458; 257/431; 257/53
(58) Field of Search ............... 136/246, 256, 136/244, 261, 258, 257; 368/205; 257/436, 458, 431, 53; 438/65, 66, 69, 70, 96

(56) References Cited

U.S. PATENT DOCUMENTS

| | | | |
|---|---|---|---|
| 4,642,413 A | * | 2/1987 | Ovshinsky ................. 136/249 |
| 5,782,995 A | | 7/1998 | Nanya et al. |
| 6,049,035 A | * | 4/2000 | Tsuri et al. ................. 136/246 |
| 6,268,558 B1 | * | 7/2001 | Kubota ........................ 136/244 |
| 6,372,977 B1 | * | 4/2002 | Miyoshi ...................... 136/246 |
| 2001/0013361 A1 | * | 8/2001 | Fujisawa et al. ............. 136/256 |

FOREIGN PATENT DOCUMENTS

JP 58-74087 A * 5/1983

* cited by examiner

*Primary Examiner*—Alan Diamond
(74) *Attorney, Agent, or Firm*—Griffin & Szipl, P.C.

(57) ABSTRACT

There is described a colored photovoltaic cell (1) with a semiconductor, preferably silicon, which has high efficiency and a pleasing colored appearance, allowing it to be used as a dial for a watch or another electronic apparatus powered by the cell. The cell includes a reflective metal substrate (2) serving as the bottom electrode, a stack of hydrogenated amorphous silicon layers forming p-i-n junctions (8), and a transparent top electrode (9). The latter may be coated with a layer (16) of slightly diffusing lacquer, which may be colorless or colored. The respective thicknesses $e_1$ of the top electrode and $e_2$ of the silicon are combined as a function of the refractive indices of the materials so as to produce an interferential reflection in a predetermined reflection spectrum.

24 Claims, 5 Drawing Sheets

PHOTOVOLTAIC CELL HAVING A COLORED APPEARANCE, PARTICULARLY FOR A WATCH DIAL

The present invention concerns a photovoltaic cell, also called a solar cell, which can be used to form a dial for a watch or another electronic apparatus and to provide the watch or apparatus with electric power.

The invention concerns more particularly a colored photovoltaic cell of the type including from the bottom to the top a substrate, a bottom reflecting electrode placed on the substrate or integrated therein, an active photodiode part formed of semiconductor layers, and a top electrode. The invention also concerns a watch dial including such a colored photovoltaic cell.

The use of photovoltaic cells as dials for wristwatches encounters several problems which may be of a technical or aesthetic nature. First, when the watch is worn, the cell or a set of cells connected in series has to generate sufficient power not only in the short term, but also in terms of the annual energy balance of the storage element (accumulator), to take account of periods of poor light, in particular the winter. As the surface area of a watch dial is limited, the cell has to have sufficient photovoltaic efficiency. Further, one wishes to have as thin a cell as possible. Photovoltaic cells made of amorphous silicon are advantageous in this respect, particularly if the substrate is metal in nature and forms one of the current collector electrodes.

On the other hand, aesthetic criteria are important in the field of horology. They result in the use of a single cell being preferred to that of several juxtaposed cells connected in series, in order to avoid the lines of separation and interconnection which remain visible between the cells. One primordial aesthetic aspect is that of color. The amorphous silicon cells deposited on a metal substrate have in themselves a greyish appearance which is unattractive. Various publications proposing solutions to avoid this drawback will be mentioned hereinafter. Finally, in addition to obtaining attractive, varied and sufficiently light colors, one may wish the dial to give either specular reflection, or diffuse reflection.

European Patent No. 872 783 discloses a watch dial, formed of a single hydrogenated amorphous silicon photovoltaic cell (α-Si:H), whose top electrode is formed of a transflective, i.e. semi-reflecting, metal layer, which preferably reflects between 60% and 85% of the incident light. This permits a simple and thin construction, giving the dial a metallic lustre, but the photovoltaic efficiency is reduced by the fact that most of the incident light is reflected towards the exterior or absorbed in the metal layer and thus does not reach the silicon.

Another category of solutions known, in particular, from European Patent Nos. 788 037 and 819 995, consists in placing on the photovoltaic cell a plate formed of various translucent colored layers themselves providing the desired appearance of the dial. However, these plates have to be diffusing to conceal the silicon, which on the one hand reduces the quantity of light reaching the photodiode and on the other hand gives the dial a milky appearance lacking in lustre. Moreover, this plate increases the total thickness of the construction.

The object of the present invention is to create a photovoltaic cell allowing the aforementioned drawbacks to be avoided when it is used as a watch dial or an apparatus imposing the same aesthetic criteria. In particular, the invention should allow a wide choice of colors for the dial, without excessively reducing the portion of incident light which reaches the photodiode. An additional object is to offer the designer the choice between a specular reflection and a diffuse reflection of the incident light.

According to a first aspect of the invention, there is provided a photovoltaic cell of the type indicated hereinabove, characterised in that the pair of respective thicknesses of the top electrode and the active photodiode part is selected as a function of the respective refractive indices of their materials so as to generate an interferential reflection of the incident light according to a predetermined reflection spectrum.

Thus, the multi-layered structure of the photovoltaic cell constitutes a reflective interferential filter with which it is possible to obtain a wide range of colors of the reflected light, simply by an appropriate choice of the thicknesses of the layers generating the interferential reflection, by using the constituent materials of the photovoltaic cell. In practice, said thicknesses are selected from the ranges of thickness compatible with the proper operation of the photovoltaic cell, in particular with regard to the power which it provides.

The parts of the spectrum in which a substantial fraction of the incident light is reflected towards the exterior may be relatively narrow, so that most of the incident ambient light is absorbed by the photodiode to generate the electric power. All other conditions being equal, this type of cell thus allows currents to be obtained which are significantly higher than those of a cell with a semi-reflective metallic top electrode covered with colored gloss. The photodiode can advantageously be made in a conventional manner from hydrogenated amorphous silicon. Preferably, the substrate is metal and serves both as the bottom electrode and the reflector.

Preferably, the active part of the silicon photodiode has a thickness comprised between 100 and 600 nm and the top electrode has a thickness comprised between 60 and 300 nm, the pairing of these two thicknesses resulting in a determined color of the reflected light. In particularly preferred ranges of thickness, the active part of the silicon photodiode has a thickness comprised between 250 and 450 nm and the top electrode has a thickness comprised between 70 and 150 nm. Below these lower limits, the sheet resistance of the top electrode increases, creating undesirable ohmic losses, and the power conversion in the silicon is reduced if the thickness of the silicon is too small. Above the aforementioned upper limits, the deposition of the top electrode becomes too expensive and the mechanical hold of the silicon on the substrate becomes problematic.

In order to further enlarge the palette of available colors, a development of the invention consists in that the top electrode is covered with a clear or transparent lacquer, which may also be diffusing. This layer may further contain colorants or pigments, thus exhibiting a predetermined absorption spectrum in order to modulate the color of the reflected light by absorbing certain wavelengths. These techniques allow dials simulating the appearance and colors of conventional watch dials to be obtained.

BRIEF DESCRIPTION OF THE DRAWINGS

Other features and advantages of the present invention will appear from the following description of various embodiments, given by way of non-limiting example with reference to the annexed drawings, in which.

DETAILED DESCRIPTION OF THE PREFERRED EMBODIMENTS OF THE INVENTION

Figure 1:
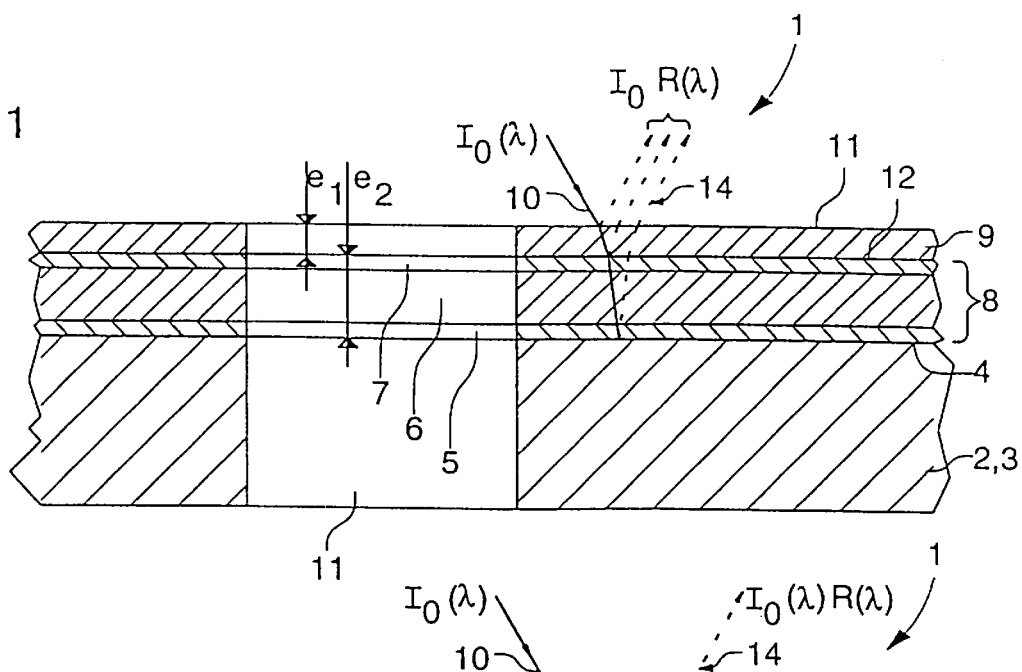
FIG. 1 is a schematic partial cross-section of a first embodiment of a photovoltaic cell according to the invention, forming a watch dial.

The watch dial shown in FIG. 1 is formed by a photovoltaic cell 1 according to the present invention, including a metal substrate 2 which serves as bottom electrode 3 of the cell. Substrate 2 is preferably made of stainless steel, but other metals such as aluminium or a metal substrate coated with chromium may be used. The top surface 4 of the substrate reflects light, either specularly, or in a diffused manner, in order to improve the power efficiency. Substrate 2 supports a stack of three thin layers 5, 6 and 7 of hydrogenated amorphous silicon, respectively of types n, i and p or conversely, to form the active part of a n-i-p or p-i-n junction photodiode, indicated by reference 8. Onto the stack of silicon layers there is applied a transparent top electrode 9 formed of a thin layer of conductive oxide, for example a layer of indium oxide doped with tin (ITO), or a layer of tin oxide doped with antimony.

In the watch, the connection of the electrodes to the charge circuit of the electric accumulator is effected in a conventional manner on an edge of the dial formed by cell 1. A central hole 11 is arranged through the dial, to allow the shafts of the watch hands to pass.

Of course, bottom electrode 3 could include a reflective metal layer made of a material distinct from substrate 2, in the event that the material of the substrate was not compatible with the adjacent n or p type layer 5.

The silicon and ITO layers can be deposited by conventional methods allowing the thickness of the layers to be carefully controlled, for example RF plasma deposition for the silicon and cathodic sputtering deposition for the ITO. Examples of methods for manufacturing photovoltaic cells of this type in batches are explained in particular in U.S. Pat. Nos. 4,485,125 and 5,457,057 and European Patent No. 948 060.

The layers of silicon forming the active photodiode part 8 have a controlled total thickness $e_2$ and a refractive index having a real part of approximately 4. The ITO forming top electrode 9 has a controlled thickness $e_1$ and a real refractive index of approximately 2, absorption being able to be ignored in the particular case of such a layer. Consequently, the two constituent layers 8 and 9 of the photovoltaic cell, arranged between the air and the metal substrate, form an interferential optical system having a reflectance $R(\lambda)$, where $\lambda$ is the wavelength of the incident light 10, which has a spectral intensity $I_0(\lambda)$, The light 14 reflected by cell 1, of spectral intensity $I_0(\lambda)R(\lambda)$, has a colored appearance dependent on the reflectance $R(\lambda)$ defined by the indices and thicknesses of the elements of the interferential system.

Knowing the refractive indices of the materials used to make the photovoltaic cell, one can calculate the interferential reflection spectrum and the corresponding chromatic indices as a function of thicknesses $e_1$ and $e_2$ and select the combinations of thickness providing the desired colors, taking account of the constraints imposed to obtain good electrical and mechanical characteristics for the photoelectric cell. The same operations may be made with other materials having other refractive indices.

Figure 2:
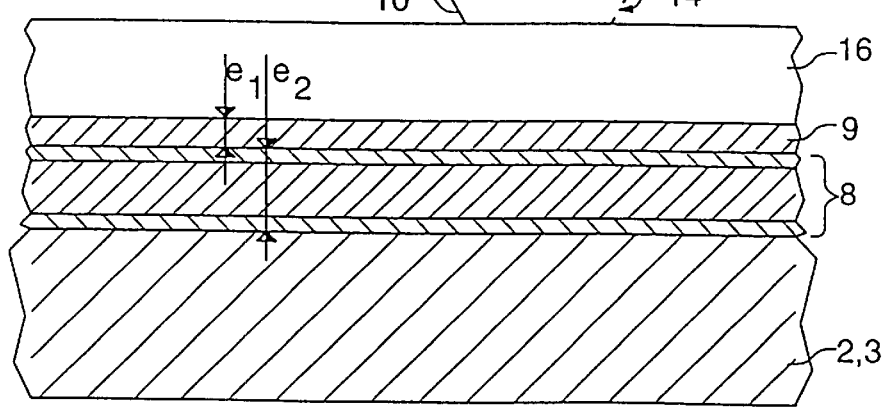
FIG. 2 is a similar view to FIG. 1, showing a second embodiment of the invention.

FIG. 2 shows a second embodiment wherein the structure of photovoltaic cell 1 described with reference to FIG. 1 is completed by a layer of clear or diffusing lacquer 16, applied onto top electrode 9. This layer, having a refractive index of approximately 1.5 and a thickness of the order of 1 $\mu$m to several tens of $\mu$m, modifies the reflectance $R(\lambda)$ of the subjacent interferential system, because its refractive index is different to that of the ITO. Moreover, a diffusing lacquer reproduces the appearance of conventional dials better, while reducing or removing the angular dependence of the interferences in the reflected light. In this example, the lacquer of layer 16 has no intrinsic absorption, i.e. no color of its own. Since its thickness is relatively large, its only notable influence in the interferential reflection is that of its refractive index modifying the optical conditions at the interface between the lacquer and top electrode 9. Further, the lacquer constitutes mechanical and chemical protection for electrode 9.

Figure 3:
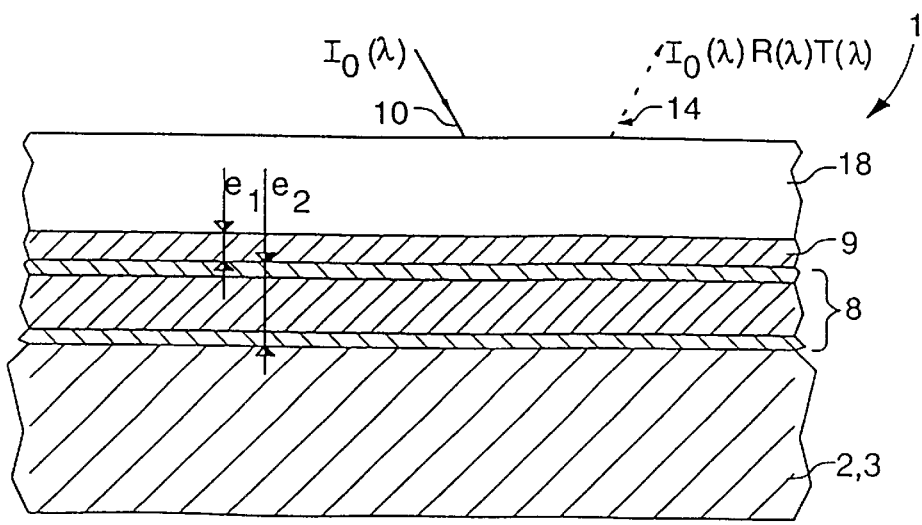
FIG. 3 is a similar view to FIG. 1, showing a third embodiment of the invention.

FIG. 3 shows a third embodiment wherein the structure of photovoltaic cell 1 described with reference to FIG. 1 is completed by a layer of colored lacquer 18, which is transparent or slightly diffusing, applied onto top electrode 9. In addition to producing the same effects as the layer of colorless lacquer 16, colored lacquer 18 has a transmission spectrum $T(\lambda)$ which modifies the reflected light 14 the spectrum of which is obtained by convoluting spectra $I_0(\lambda)$, $R(\lambda)$ and $T(\lambda)$. By this means, it is possible to modify the color of the reflected light, for example in order to remove certain undesirable components of the interferential reflection spectrum. This allows a great number of nuances of color to be obtained by using the principles of the present invention.

Figure 4:
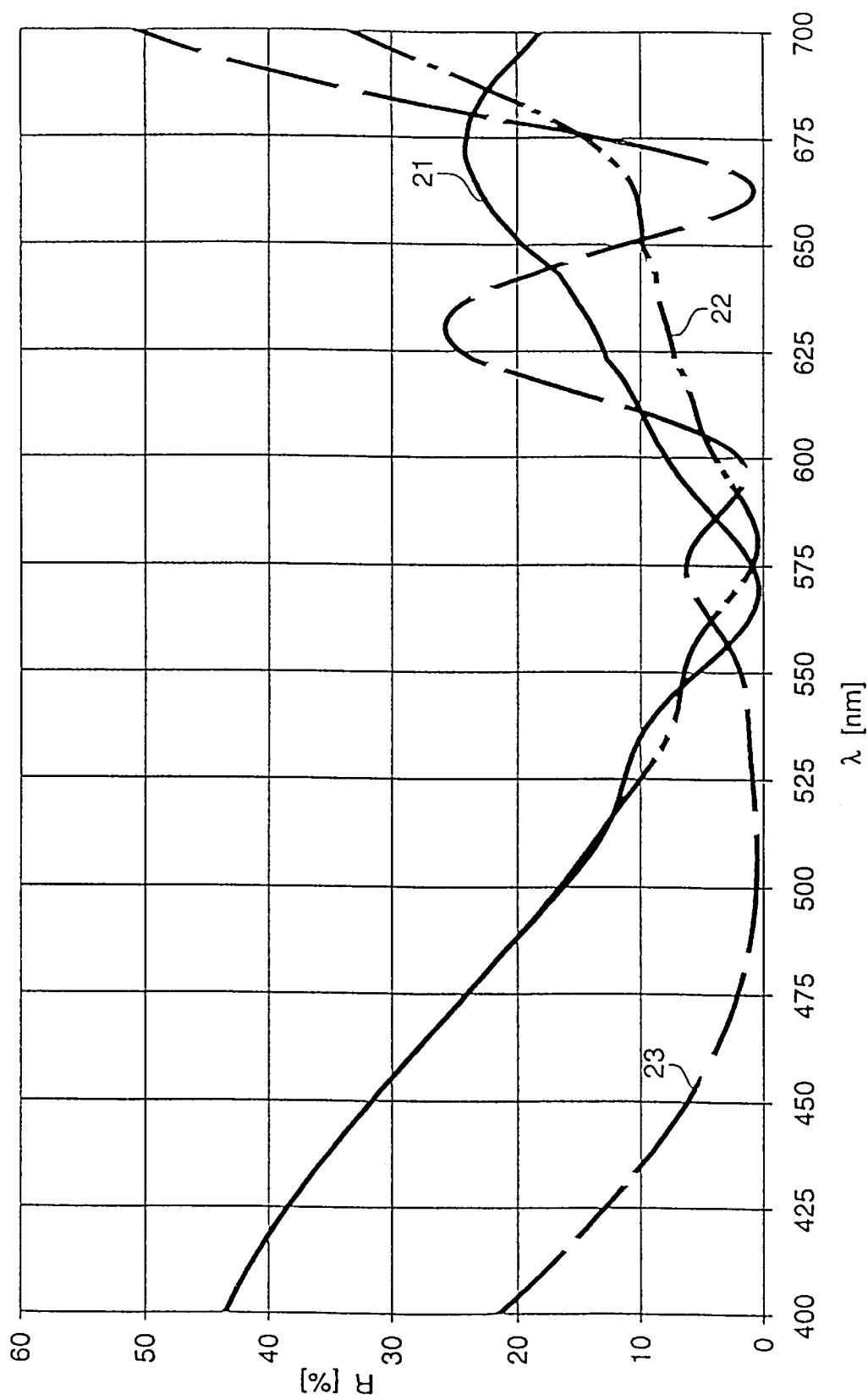
FIG. 4 shows the reflectance as a function of the wavelength, obtained with the structure illustrated by FIG. 1 for different pairs of thickness of the silicon and the transparent top electrode.
Figure 5:
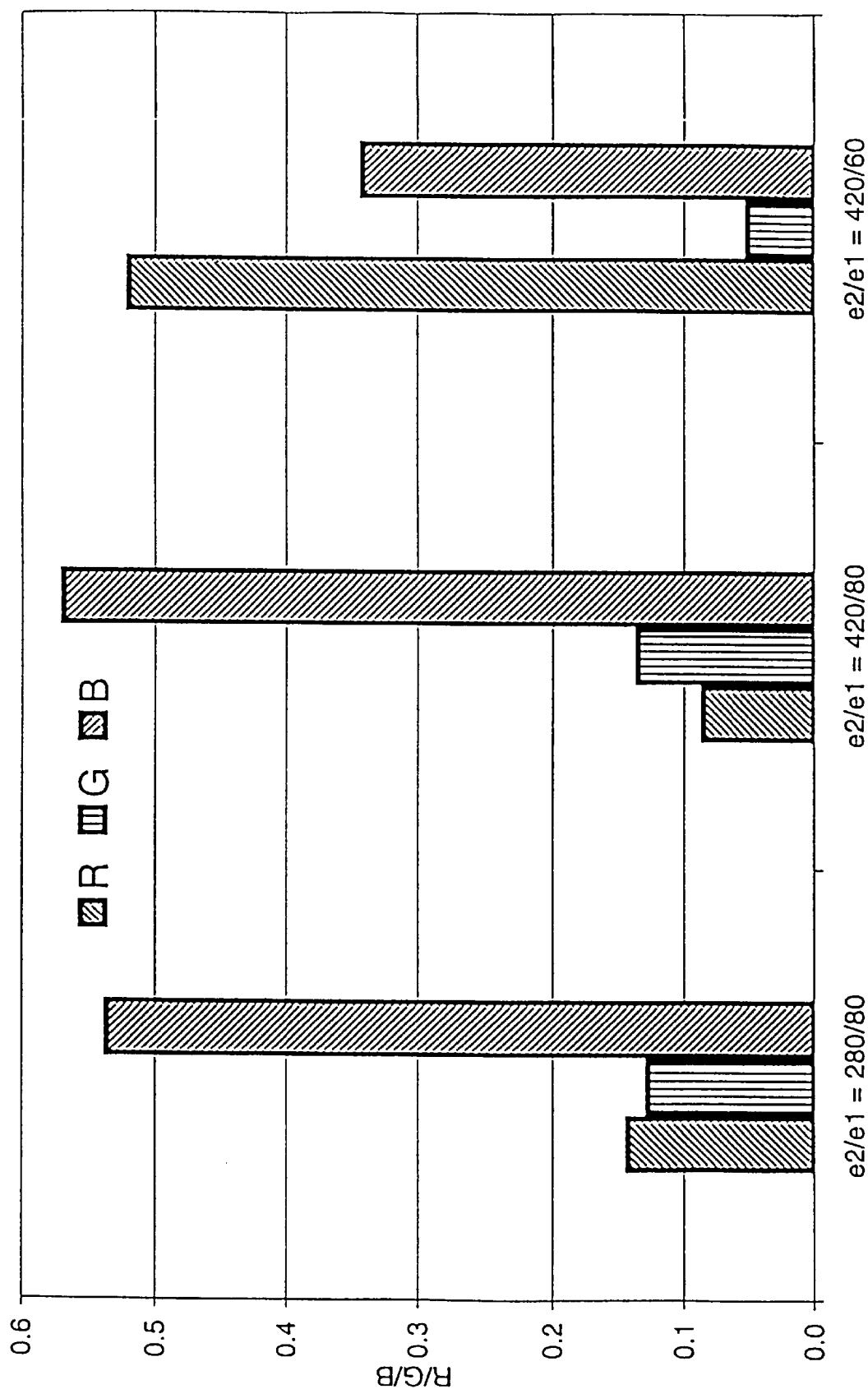
FIG. 5 shows the RGB co-ordinates of the reflected light for the structures whose reflection spectrum is shown in FIG. 4.

FIG. 4 is a spectral diagram of the reflectance R as a function of the wavelength $\lambda$ for three examples of photovoltaic cells having the structure illustrated in FIG. 1, for three different pairs of thicknesses $e_1$ and $e_2$. FIG. 5 shows the coordinates of colors R (red), G (green) and B (blue) for these three examples.

Spectrum 21, shown in continuous lines, corresponds to thickness values $e_2$=280 nm of silicon and $e_1$=80 nm of ITO. According to FIG. 5, the reflected light will have a dominant blue color.

Spectrum 22, shown in dot-and-dash lines, corresponds to the same value $e_1$=80 nm as in the preceding example, but with a value $e_2$=420 nm for the silicon thickness. It can be seen that the spectrum is thus modified in the green and red region and that the reflected light will also have a dominant blue color but slightly different.

Spectrum 23 shown in dashed lines, corresponds to the same value $e_2$=420 nm as in the preceding example, but with a value $e_1$=60 nm instead of 80 nm for the ITO thickness. It can be seen that the spectrum is thus greatly modified in several regions and that the reflected light will have a dominant magenta color. It can thus be deduced that the thicknesses of the ITO electrode has a preponderant importance in the examples considered.

Figure 6:
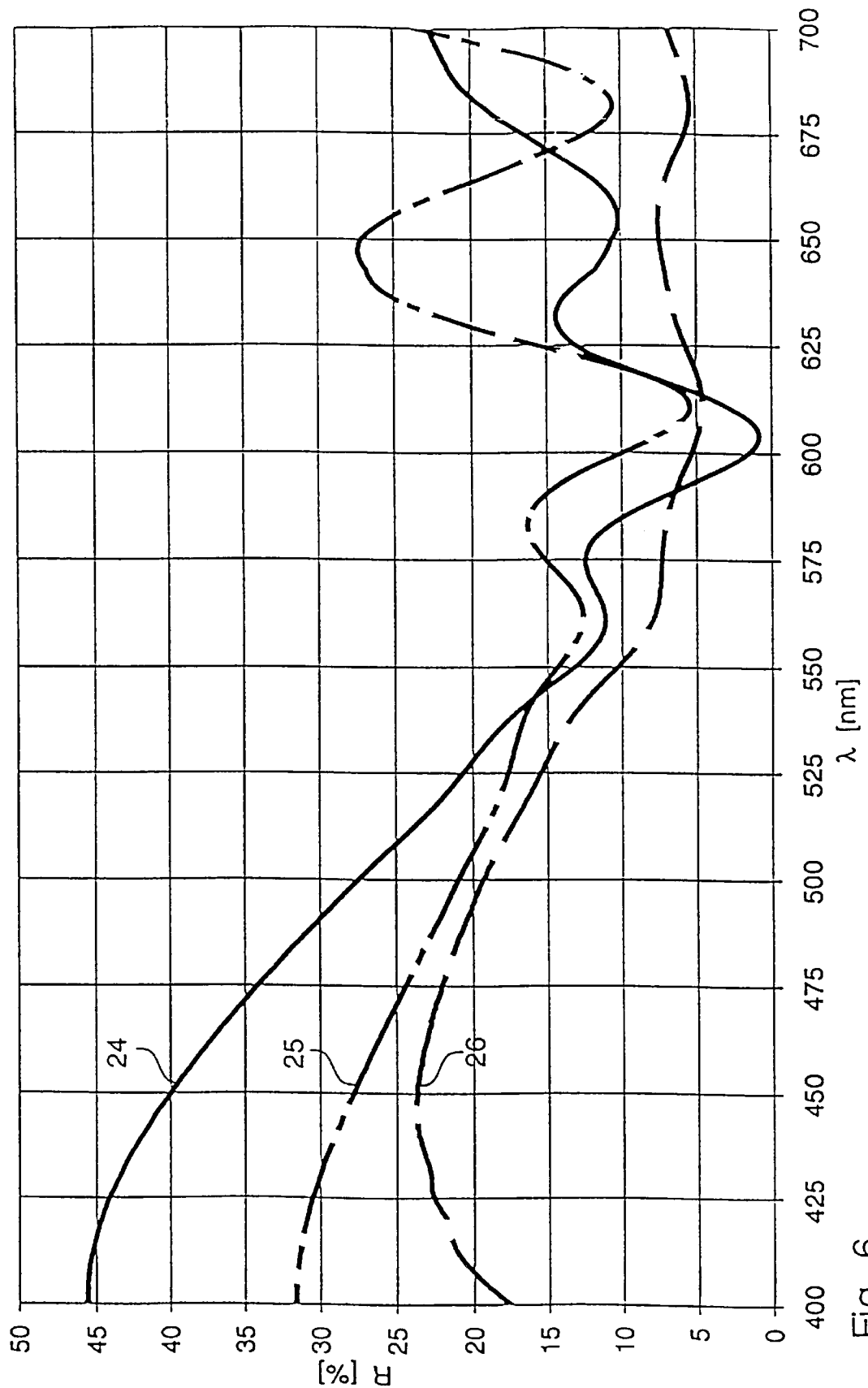
FIG. 6 shows the reflectance as a function of the wavelength, obtained with the structures respectively illustrated in FIGS. 1, 2 and 3, for a chosen pair of respective thickness of the silicon and the transparent top electrode.
Figure 7:
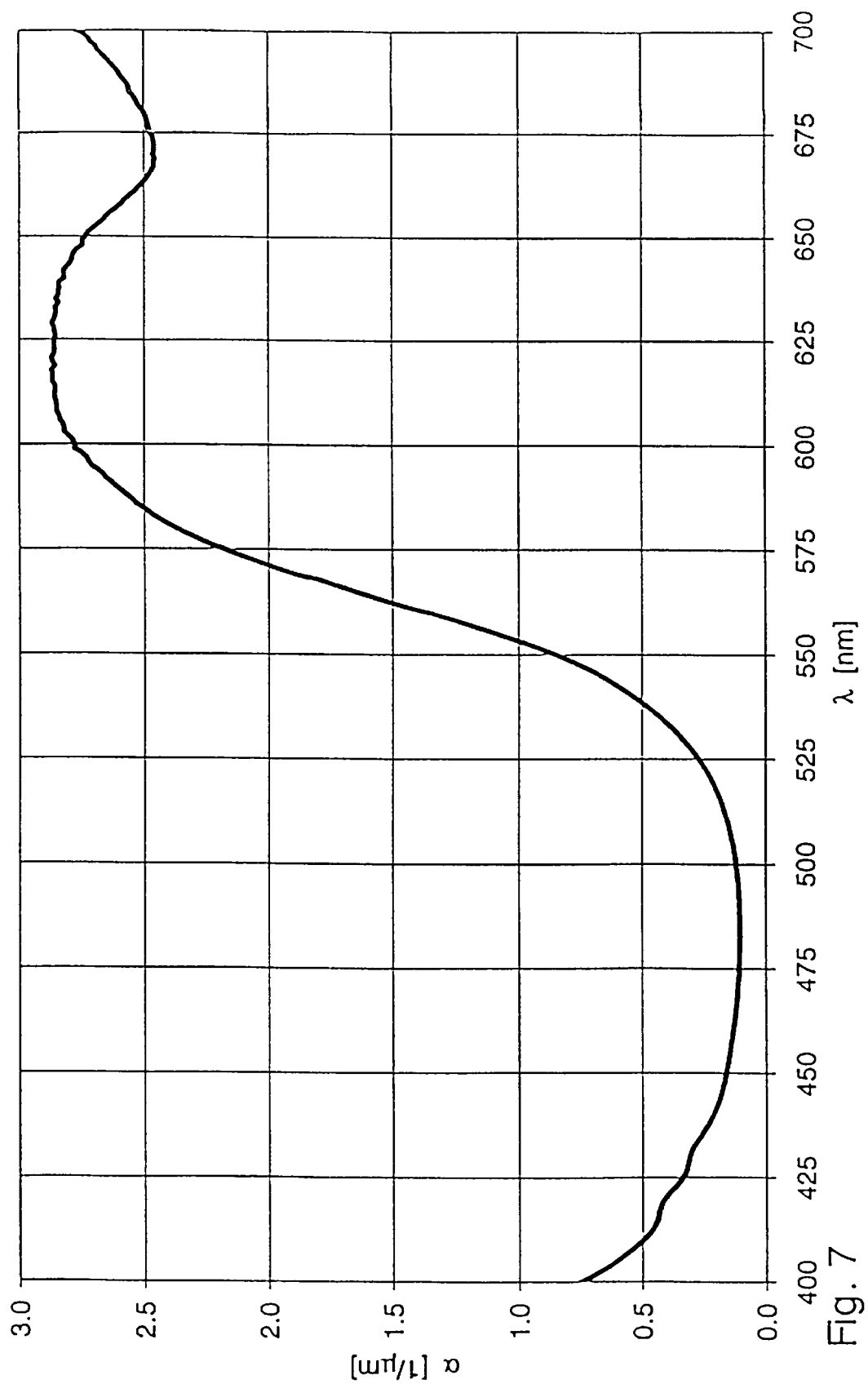
FIG. 7 shows the absorption spectrum of a colorant used in one of the cases shown in FIGS. 3 and 6 (curve 26).

FIG. 6 is a spectral diagram of the reflectance R as a function of the wavelength $\lambda$ for three examples of photovoltaic cells having the structures illustrated respectively in FIGS. 1, 2 and 3, for a same pair of values $e_2$=450 nm and $e_1$=90 nm of the respective thickness of silicon and ITO. Spectrum 24, shown in a continuous line, corresponds to the lacquer free version of FIG. 1 and has a strong blue dominance. Spectrum 25, shown in dot-and-dash lines, corresponds to the version of FIG. 2, with a layer of colorless lacquer 16 of index 1.5 having a thickness of several $\mu$m. In comparison to spectrum 24, it is greatly reduced in blue and much more marked in green and red. Spectrum 26, shown in a dashed line, corresponds to the version of FIG. 3, with a layer of lacquer 18 mixed with a blue colorant whose absorption spectrum $\alpha(\lambda)$ is shown in FIG. 7, this layer having a thickness of several $\mu$m. It can be seen that the addition of colorant reduces the quantity of reflected light, especially in yellow and red.

The examples given hereinbefore show that the present invention provides those skilled in the art with the means to design photovoltaic cells having the most simple structure possible and sufficient efficiency, while exhibiting a predetermined color, so that they are well suited to serve as dials for watches or other portable apparatus the aesthetic appearance of which is an important parameter.

What is claimed is:

1. A colored photovoltaic cell including from the bottom to the top a substrate, a reflective bottom electrode placed on said substrate or integrated therein, an active photodiode part formed of semiconductor layers having a first refractive index, a transparent top electrode having a second refractive index and an optical interface with the active photodiode part, and a layer of clear lacquer formed on the top electrode and having a third refractive index and an optical interface with the top electrode, said first, second and third refractive indices being different from each other, wherein the pair of respective thicknesses of the top electrode and the active photodiode part produce an interferential reflection of incident light according to a colored reflection spectrum that is a function of said first, second and third refractive indices.

2. A photovoltaic cell according to claim 1, wherein said semiconductor layers are made of hydrogenated amorphous silicon of types n, i and p.

3. A photovoltaic cell according to claim 1, wherein said layer of lacquer is diffusing.

4. A photovoltaic cell according to claim 1, wherein said layer of lacquer contains colorants or pigments.

5. A photovoltaic cell according to claim 1, wherein said substrate is metal and acts both as said bottom electrode and as a reflector.

6. A photovoltaic cell according to claim 2, wherein said active photodiode part has a thickness comprised between 100 and 600 nm and said top electrode has a thickness comprised between 60 and 300 nm, the pairing of said thicknesses leading to a color of the reflected light.

7. A photovoltaic cell according to claim 6, wherein said active photodiode part has a thickness comprised between 250 and 450 nm and said top electrode has a thickness comprised between 70 and 150 nm.

8. A watch dial including a photovoltaic cell according to claim 1.

9. A watch dial according to claim 8 formed by a single photovoltaic cell, having a substrate which constitutes a substrate of the watch dial.

10. A method for manufacturing a colored photovoltaic cell including from the bottom to the top a substrate, a reflective bottom electrode placed on said substrate or integrated therein, an active photodiode part formed of semiconductor layers, and a transparent top electrode, comprising the steps of:

providing a substrate forming said bottom electrode or coated with said bottom electrode;

depositing onto said bottom electrode said active photodiode part made of semiconductor material, having a first refractive index and a first controlled thickness; and depositing onto said active photodiode part a transparent top electrode having a second refractive index and a second controlled thickness;

wherein the pair of said first and second controlled thicknesses is selected as a function of said first and second refractive indices to produce an interferential reflection of incident light according to a colored reflection spectrum.

11. The method of claim 10, wherein said semiconductor material is hydrogenated amorphous silicon.

12. The method of claim 10, further comprising the step of coating said top electrode with a layer of clear lacquer having a third refracting index, which is different from said second refractive index.

13. The method of claim 12, wherein said layer of lacquer is diffusing.

14. The method of claim 12, wherein said layer of lacquer contains colorants or pigments.

15. The method of claim 10, wherein said substrate is metal and acts both as said bottom electrode and as a reflector.

16. The method of claim 11, wherein said active photodiode part has a thickness comprised between 100 and 600 nm and said top electrode has a thickness comprised between 60 and 300 nm.

17. The method of claim 16, wherein said active photodiode part has a thickness comprised between 250 and 450 nm and said top electrode has a thickness comprised between 70 and 150 nm.

18. A method for manufacturing a colored photovoltaic cell including from the bottom to the top a substrate, a reflective bottom electrode placed on said substrate or integrated therein, an active photodiode part formed of semiconductor layers, a transparent top electrode and a layer of clear lacquer, comprising the steps of:

providing a substrate forming said bottom electrode or coated with said bottom electrode;

depositing onto said bottom electrode an active photodiode part made of semiconductor material, having a first refractive index and a first thickness;

depositing onto said active photodiode part a transparent top electrode having a second refractive index and a second thickness; and coating said top electrode with a layer of clear lacquer having a third refracting index, which is different from said second refractive index;

wherein the pair of said first and second thicknesses is selected as a function of said first, second and third refractive indices to produce an interferential reflection of incident light according to a colored reflection spectrum.

19. The method of claim 18, wherein said semiconductor material is hydrogenated amorphous silicon.

20. The method of claim 18, wherein said layer of lacquer is diffusing.

21. The method of claim 18, wherein said layer of lacquer contains colorants or pigments.

22. The method of claim 18, wherein said substrate is metal and acts both as said bottom electrode and as a reflector.

23. The method of claim 18, wherein said active photodiode part has a thickness comprised between 100 and 600 nm and said top electrode has a thickness comprised between 60 and 300 nm.

24. The method of claim 23, wherein said active photodiode part has a thickness comprised between 250 and 450 nm and said top electrode has a thickness comprised between 70 and 150 mn.

* * * * *